United States Patent [19]

Glomb et al.

[11] Patent Number: 5,077,816

[45] Date of Patent: Dec. 31, 1991

[54] FIBER EMBEDDED GRATING FREQUENCY STANDARD OPTICAL COMMUNICATION DEVICES

[75] Inventors: Walter L. Glomb, Ellington; Frederick J. Leonberger, Glastonbury, Conn.

[73] Assignee: United Technologies Corporation, Hartford,, Conn.

[21] Appl. No.: 457,044

[22] Filed: Dec. 16, 1989

[51] Int. Cl.$^5$ .......................... G02B 6/34; H01S 3/10; H04J 1/00

[52] U.S. Cl. ........................................ 385/37; 385/43; 385/24; 385/140; 372/20; 108/359; 359/124; 359/130; 359/188; 359/193; 359/195

[58] Field of Search ............... 350/96.15, 96.16, 96.19, 350/96.29, 96.30; 372/6, 102, 20, 108; 370/1, 3; 455/609, 610, 612, 602

[56] References Cited

U.S. PATENT DOCUMENTS

| | | | |
|---|---|---|---|
| 4,737,007 | 4/1988 | Alferness et al. | 350/96.19 |
| 4,807,950 | 2/1989 | Glenn et al. | 350/96.19 X |
| 4,947,134 | 8/1990 | Olsson | 455/602 X |
| 5,001,720 | 3/1991 | Ackerman et al. | 372/50 |
| 5,016,967 | 5/1991 | Meltz et al. | 350/96.19 |
| 5,029,967 | 7/1991 | Livezey et al. | 350/96.19 |
| 5,033,812 | 7/1991 | Yoshida et al. | 350/96.19 |

Primary Examiner—Brian Healy
Attorney, Agent, or Firm—Peter R. Ruzek

[57] ABSTRACT

A narrowband laser source includes an optical fiber section including a core centered on a longitudinal axis and a cladding surounding the core, and having a grating region embedded in the core. The grating region includes a multitude of Bragg grating elements extending with a substantially equal longitudinal spacing substantially normal to the longitudinal axis for the grating region to significantly reduce the amount of light passing therethrough when the frequency of such light is in a predetermined narrow range around and including a predetermined center frequency, to an extent proportionate to the deviation of such frequency from the center frequency. A portion of the light emitted by a laser at a frequency dependent on the amount of electric energy applied to the laser is supplied into the core of the fiber section for propagation toward the grating region. The amount of light passing through the grating region is detected, and the amount of energy applied to the laser is varied in dependence on the extent of deviation of the frequency of such light from the center frequency in such a sense as to reduce the extent of such deviation.

2 Claims, 3 Drawing Sheets

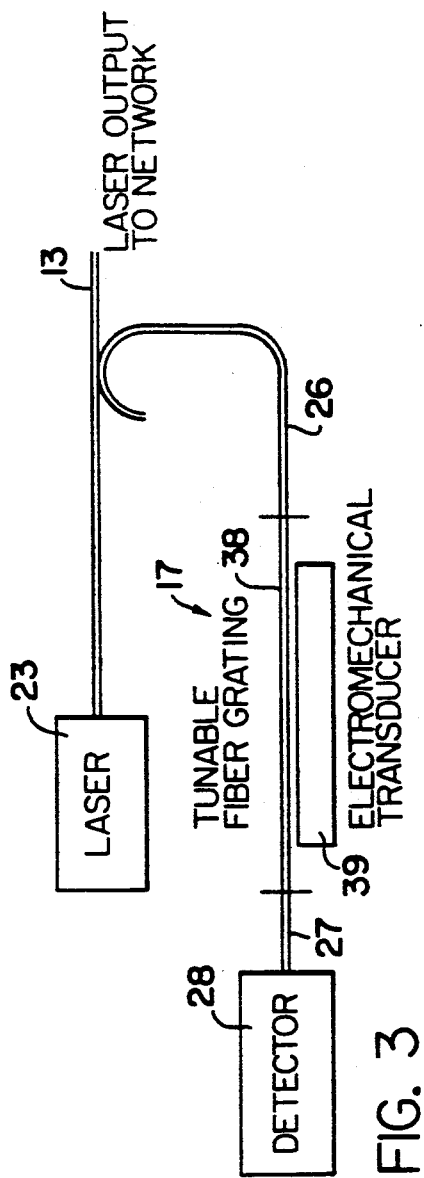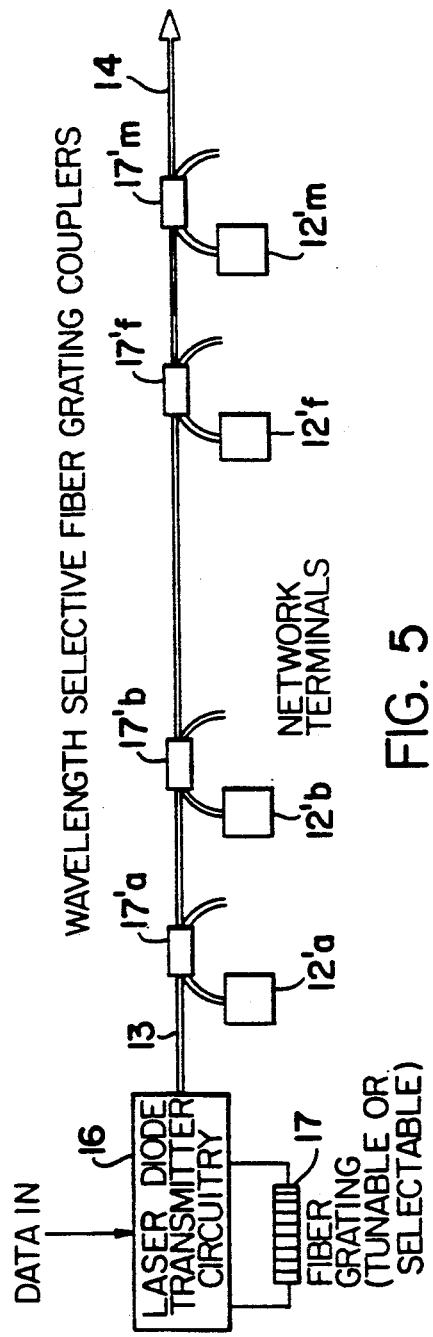

FIBER EMBEDDED GRATING FREQUENCY STANDARD OPTICAL COMMUNICATION DEVICES

DESCRIPTION

1. Technical Field

The present invention relates to controllable frequency optical communication systems in general, and more particularly to optical communication devices that are especially suited for use in such systems.

2. Background Art

There are already known various constructions of communication systems, among them such employing frequency division multiplexing (FDM) that provides versatile multi-channel capability because different types of information (digital, voice, analog video, radar) can be transmitted simultaneously in different frequency bands or channels. Yet, radio frequency and microwave bands offer only limited bandwidth for these services. Furthermore, secure radio frequency and microwave transmission media are difficult to deploy and consume a large amount of electrical power. Therefore, for very high capacity networks, it is desirable if not mandatory to move the information carrier to higher frequencies, especially into the optical domain.

Fiber-optic transmission offers a lightweight, secure medium requiring relatively low power transmitters and exhibiting intrinsic immunity to electromagnetic interference along transmission paths. Fiber optic transmission media offer more than 20,000 GHz of bandwidth for high speed transmissions from AlGaAs and InGaAsP semiconductor lasers. Such transmitters currently provide up to 10 GHz signalling rate. Optical frequency or wavelength division multiplexing (WDM) may then be used to transmit different signal types simultaneously.

In optical FDM networks, it is necessary to insure the alignment of system elements in the optical frequency domain. Lasers in local oscillators must be tuned to laser transmitter frequencies, and transmitters must be tuned to the pass bands of optical filters. In frequency division multiplex systems, the tolerances accompanying these alignments require that a reference standard be available at each of the transmitters and receivers. It would be advantageous, for a variety of reasons, to use solid state lasers as the laser light sources in such networks. However, such lasers have the drawback that, due to the inadequate control of their laser frequency dependency on applied electric current as a result of unavoidable manufacturing tolerances, as well as to their considerable thermal drift characteristic, they cannot serve as reliable frequency standards on their own. On the other hand, a significant advantage of solid state lasers is that their operating frequency can be easily tuned by varying the current through the laser diode. This means that the laser frequency can be stabilized at any desired value by appropriately controlling the laser diode current.

To control the diode current, it is necessary first to determine the frequency of the light emitted by the diode laser, then to determine the difference between this actual light frequency and the desired one, and then to adjust the current flowing through the laser diode accordingly. All of this must be done on a continuous or frequently repetitive basis so as to keep the actual laser emission frequency from unacceptably drifting away from the desired one. It may be seen that, for this control operation to achieve the desired results, that is to obtain tuning of the laser to the desired frequency, it is important to use a frequency standard or reference external to the laser diode that can be accurately tuned to and maintained at the desired frequency. The requirement for accuracy of such a frequency standard becomes a paramount concern when it is desired to provide a high density optical communication system.

Another important consideration, which also acquires critical significance as the communication channel density increases, is the ability of the optical receiver to tune or remain tuned to the optical carrier frequency of the respective optical communication channel. While currently available frequency standards operating in the optical domain (resonators, comb filters and the like) deliver acceptable performance for many current applications where it is not mandatory to determine the actual frequency of the emitted laser light with a high degree of precision, they still leave much to be desired as far as the bandwidth of their operation is concerned, so that they cannot be used in telecommunication applications requiring close spacing of adjacent optical channels. More particularly, WDM filters currently used for filtering in the optical domain are not selective enough for full utilization of the optical spectrum. As a matter of fact, the conventional optical filters are merely capable of separating channels down to a 600 GHz spacing, which by far exceeds the modulation bandwidth of laser transmitters. As a result, commercially available WDM systems typically provide only ten channels or less within the transmission band of the transmitter and, consequently, most of the optical spectrum is either wasted or not fully utilized.

One previously adopted approach to avoid this problem and to obtain higher density optical FDM communication systems has been to heterodyne the optical carrier at the receiver down to intermediate frequency that is either in the radio frequency or in the microwave frequency range, and then to use the superior selectivity of electronic filters for discriminating between the various channels. Under these circumstances, the optical communication channels can be more closely packed than when optical filtering using the conventional optical filters is used at the receiver. However, this approach requires complex frequency tracking in the receiver and has problems in signal acquisition, especially when many carriers are present as they are in a frequency multiplex network. For example, to initially find the desired carrier frequency, a receiver must usually scan the entire transmission band in search of a recognizable signal, and only then will it be able to extract the information modulated onto the thus located carrier frequency.

Accordingly, it is a general object of the present invention to avoid the disadvantages of the prior art.

More particularly, it is an object of the present invention to provide an optical communication system which does not possess the disadvantages of the known communication systems of this kind.

Still another object of the present invention is so to develop the communication system of the type here under consideration as to be able to maximize the utilization of the available optical spectrum by keeping the spacings between adjacent optical communication channels to a minimum.

It is yet another object of the present invention to devise a frequency standard arrangement for use in the optical communication system of the above type, which renders it possible to precisely tune both the optical transmitters and receivers to the desired closely spaced communication channels.

A concomitant object of the present invention is to design the arrangement and system of the above type in such a manner as to be relatively simple in construction, inexpensive to manufacture, easy to use, and yet reliable in operation.

DISCLOSURE OF THE INVENTION

In keeping with these objects and others which will become apparent hereafter, one feature of the present invention resides in a narrowband laser source for use in an optical waveguide communication system including at least one optical transmitter, at least one optical receiver, and at least one optical communication link connecting the optical transmitter with the optical receiver. According to the present invention, this source includes an optical fiber section including a core centered on a longitudinal axis and a cladding surrounding the core, and having a grating region embedded in the core. The grating region includes a multitude of Bragg grating elements extending with a substantially equal longitudinal spacing substantially normal to the longitudinal axis for the grating region to significantly reduce the amount of light passing therethrough when the frequency of such light is in a predetermined narrow range around and including a predetermined center frequency, to an extent proportionate to the deviation of such frequency from the center frequency. The laser source further includes a laser operative for issuing light at any frequency within a frequency band including the narrow range in dependence on the amount of electric energy applied thereto, means for causing the laser to operate at a frequency within the narrow range, means for supplying a portion of the light issued by the laser into the core for propagation longitudinally thereof toward the grating region, means for detecting the amount of light passing through the grating region and issuing an error signal indicative of the extent and direction of deviation of the frequency of such light from the center frequency, and means for varying the amount of electric energy supplied to the laser in proportion to the value of the error signal.

BRIEF DESCRIPTION OF THE DRAWING

The present invention will be described in more detail below with reference to the accompanying drawing in which:

FIG. 3 is a diagrammatic view of a tunable construction of the Bragg grating that can be used in the arrangement of FIG. 1;

FIG. 5 is a view similar to that of FIG. 1 but showing a modified construction a receiver part of the optical communication system.

BEST MODE FOR CARRYING OUT THE INVENTION

Figure 1:
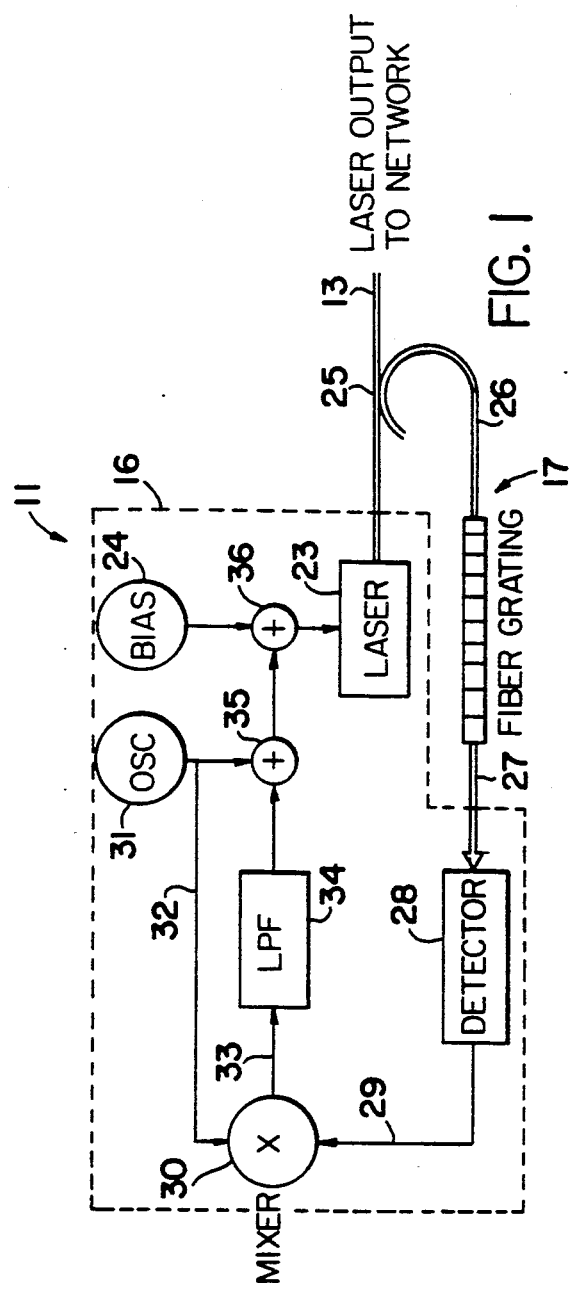
FIG. 1 is a diagrammatic view of the components of a frequency locking laser source arrangement in accordance with the present invention employed at an optical communication system transmitter or receiver.

Referring now to the drawing in detail, and first to FIG. 1 thereof, it may be seen that the reference numeral 11 has been used therein to identify a wavelength tunable laser source of the present invention in its entirety. The laser source 11 is used in an optical communication system of an otherwise known construction which includes a plurality of transmitters (wherein n is any arbitrary integral number within the capacity of the system 10), and a plurality of receivers (wherein m is any arbitrary integral number within the capacity of the optical communication system which may but need not be the same as n). The transmitters are connected with the receivers by respective individual optical transmitter links 13, a common optical transmission link, and respective individual optical receiver links.

As further shown in FIG. 1 of the drawing, of the the laser source 11 of a respective transmitter includes, in accordance with the present invention a laser diode circuitry 16 and an external optical frequency grating 17 that is connected to the respective laser diode circuitry 16 in a manner that will be explained later. Similarly, each of the receivers includes a laser source 16, an external optical frequency grating 17 and, furthermore, a coherent optical receiver which, as is known receives laser light not only from the respective one of the individual receiver links, but also from the output link 13 of the associated one of the local laser diode circuitries 16. The frequency standards 17 of the transmitters may be tuned to respective discrete frequencies to, while the frequency standards of the receivers may be be tunable (to all or selected ones of the transmitter frequencies). While the transmitters, on the one hand, and the receivers, on the other hand, are may to be situated at spaced locations, it stands to reason that, to enable two-way communications, the respective transmitters can be colocated with the respective receivers, or even be combined therewith into respective transceivers in which the transmitter and receiver sections share as much of the structure as is common to them. In the latter case, the shared transmitter and receiver section frequency standard 17 of the respective transceiver may be tunable, or each transceiver may include a plurality of frequency standards 17, each tuned to a different optical carrier frequency, as will be explained in some more detail later. Obviously, if the optical communication system were to include only one transmitter, and one or more of the receivers, then all of the employed frequency standards 17 could be matched to operate at the same frequency, or the receiver frequency standards 17 could be fixed to operate at different carrier frequencies, and the transmitter frequency standard 17 could be tunable to be able to individually address the receivers.

According to the present invention, the frequency standards 17 are constituted by respective optical fiber gratings that are applied to the coherent optical frequency division multiplex network or optical communication system to define the carrier frequencies to which the respective transmitters and receivers are tuned. Here, the fiber gratings 17 define the frequencies of the transmitters in the network, while the identical gratings 17 in the receivers define the frequencies of the local oscillators that determine the carrier frequencies to which the receivers are tuned. The inherent parallelism of frequency division multiplex allows a nonblocking circuit switched network. This concept uses a communication topology compatible with highly connected, redundant distributed star network.

Advantageously, the gratings used for the frequency standards are of the type that has been developed for sensing stress and/or temperature changes in structures and that is advantageously made by the method disclosed, for instance, in the commonly owned U.S. Pat. No. 4,807,850. As discussed in this patent, as much of the disclosure of which as necessary to fully appreciate the manner in which such gratings are made and how they operate is incorporated herein by reference, permanent periodic gratings of this kind can be provided or impressed in the core of an optical fiber by exposing the core through the cladding to the interference pattern of two compatible ultraviolet light beams that are directed against the optical fiber at two angles relative to the fiber axis that complement each other to 180°. This results in a situation where the material of the fiber core has permanent periodic variations in its refractive index impressed therein by the action of the interfering ultraviolet light beams thereon, with the individual grating elements (i.e. the periodically repetitive regions of the core exhibiting the same refractive index behavior) being oriented normal to the fiber axis so as to constitute a Bragg grating that reflects, of the light launched into the fiber core for guided propagation therein in a-propagation direction, only that having a wavelength within a very narrow range, back along the fiber axis opposite to the original propagation direction while being substantially transparent to light at wavelengths outside the aforementioned narrow band so that it does not adversely affect the further propagation of such other light. It may be seen that, in effect, this type of grating creates a notch in the transmission spectrum. The performance of this grating is illustrated in FIG. 2 of the drawing where it may be seen that a notch or stopband 22 formed in a transmission spectrum 21 by the grating 17 of this kind has a very narrow relative width.

The present invention utilizes the relatively narrow width of the notch 22 to determine the operating or carrier frequency of a current-controlled laser used in one of the transmitters in a manner that will become apparent from the following explanation of the laser source 11 that is depicted in some detail in FIG. 1 of the drawing. While the following discussion will concentrate on the use of the frequency standard grating 17 as used, in conjunction with the circuitry 16, in the transmitter, it should be clear that the operation and cooperation of the components 16 and 17 of the respective receivers are akin to those discussed here, so that only the differences need be discussed.

Figure 2:
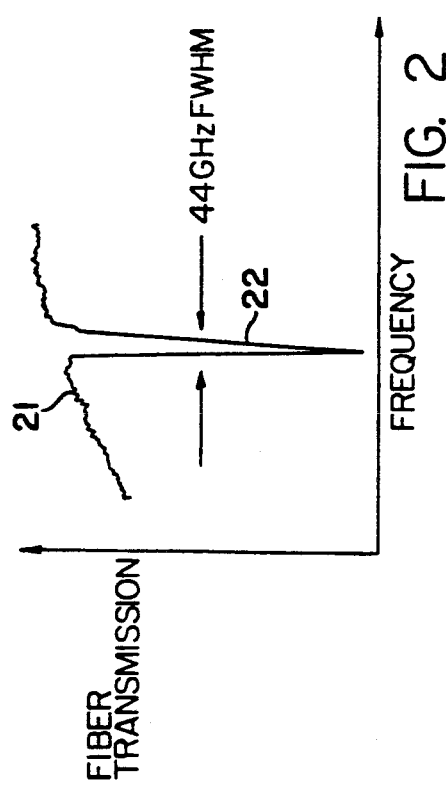
FIG. 2 is a graphic representation of the dependence of transmissivity of the grating used as the frequency standard in the arrangement of FIG. 1 on frequency.

As shown in FIG. 1, the circuitry 16 includes a laser 23 the light emission frequency of which is to be maintained within, and is determined by, the notch 22 of FIG. 2. A bias current source 24 generates a current of such a magnitude as to initially bring the light emission frequency of the laser 23, in any well known manner, into the rather narrow range of the notch 22. The light emitted by the laser 23 then propagates not only into the individual communication link 13 but also, through an optical coupler 25 and another optical link 26, such as an optical fiber, to the Bragg grating 17. From there, the light transmitted through the grating 17 is supplied through an optical output link 27 to an optical detector 28. While the elements 17, 26 and 27 are shown and described above as being separate, it will be appreciated that they could be integral with one another or, in other words, that the grating 17 could be incorporated in an optical fiber that leads all the way from the coupler 25 to the detector 28.

The detector 28 converts the optical signals reaching the same through the grating 17 into electrical signals, and these electrical signals are then supplied, through an electrical lead 29, to one input of a mixer 30. The circuitry 16 is further shown to include a dither oscillator 31 whose output is connected, through an electric connecting line 32, to another input of the mixer 30 which is constructed, in any known manner, to mix the electrical signals supplied to its inputs with one another. The output signal generated by the mixer 30 is supplied, through a connecting line 33 that has a low pass filter 34 incorporated therein, to a summing junction 35 where the output signal appearing at the output of the low pass filter 34 is combined with the oscillating output signal originating at the local oscillator 31 and the result is supplied to another summing junction 36 where it is combined with the bias signal issued by the bias current source 24.

In operation, the output signal stemming from the dither oscillator 31 causes the emission frequency of the laser 23 to move, within the confines of the narrow notch 22, around a central frequency initially determined by the current generated by the bias source 24. As a result, the attenuation of the light passing through the Bragg grating 17 to the detector 28 (which reaches its maximum when the laser emission frequency coincides with the central frequency of the notch 22) varies as the actual laser emission frequency oscillates around the central frequency of the grating 17, and the output signal of the filter 34 varies accordingly, so that the combination signal leaving the summing junction 35 is adjusted accordingly, that is, in a sense that brings the laser emission frequency toward coincidence with the central frequency of the Bragg grating 17. The principles involved in the above-discussed electronic circuitry, as well as in the modulation of the information to be transmitted onto the carrier frequency in the transmitter 11, are sufficiently well known so that no further explanation of the construction and operation thereof is deemed necessary. Similarly, the demodulation of the information from the carrier in that or those of the aforementioned receivers that is or are tuned to the respective carrier frequency also follows well known principles. In this case, the extraction of the data or information is performed in the respective coherent optical receiver mentioned above which is supplied with the incoming optical signal, as well as with the output signal of the local laser source 11 that is constructed and operates in a manner akin to that described above with the only difference being that the laser output to network, that is identified by the reference numeral 13 in FIG. 1, is connected to or replaced by a respective optical link that leads to an optical input of the associated one of the coherent optical receivers. The coherent optical receivers are of well known constructions and operate in a well known manner that need not be addressed here.

Frequency division multiplex provides a large number of channels on all links in the distributed star optical communication system, providing extra capacity for dynamic reconfiguration. Based on the 44 GHz spectral width and high extinction achieved in the optical fiber grating 17 of the type described above, 4 GHz (0.01 nm wavelength) channel spacing could be maintained using suitable control electronics. Since individual AlGaAs laser diodes are typically tunable over a 60 GHz range, rapid access to 15 channels can be achieved using direct current tuning of a single laser diode 23. Multiple lasers 23 could be selected to cover different adjacent frequency ranges of the available 10 nm band so the total optical communication system capacity would then be up to 1,000 channels.

The grating 17 could be used to tune the single laser diode 23 within its tuning bandwidth in various ways one of which is illustrated in a simplified fashion in FIG. 3 of the drawing. As shown there, the grating 17 is constructed as a tunable grating in that it consists of a grating section 38 and of a transducer 39, such as one of the electromechanical variety, which applies longitudinal stresses to the grating section 38. Such longitudinal stresses result in longitudinal strains in the grating section 38, with attendant change in the grating periodicity and a commensurate shift in the frequency of the stopband. Various constructions of transducers 39 of the types that may be employed in the environment of FIG. 3 are disclosed in a commonly owned U.S. patent application Ser. No. 456,499, the disclosure of which is incorporated here by reference.

Figure 4:
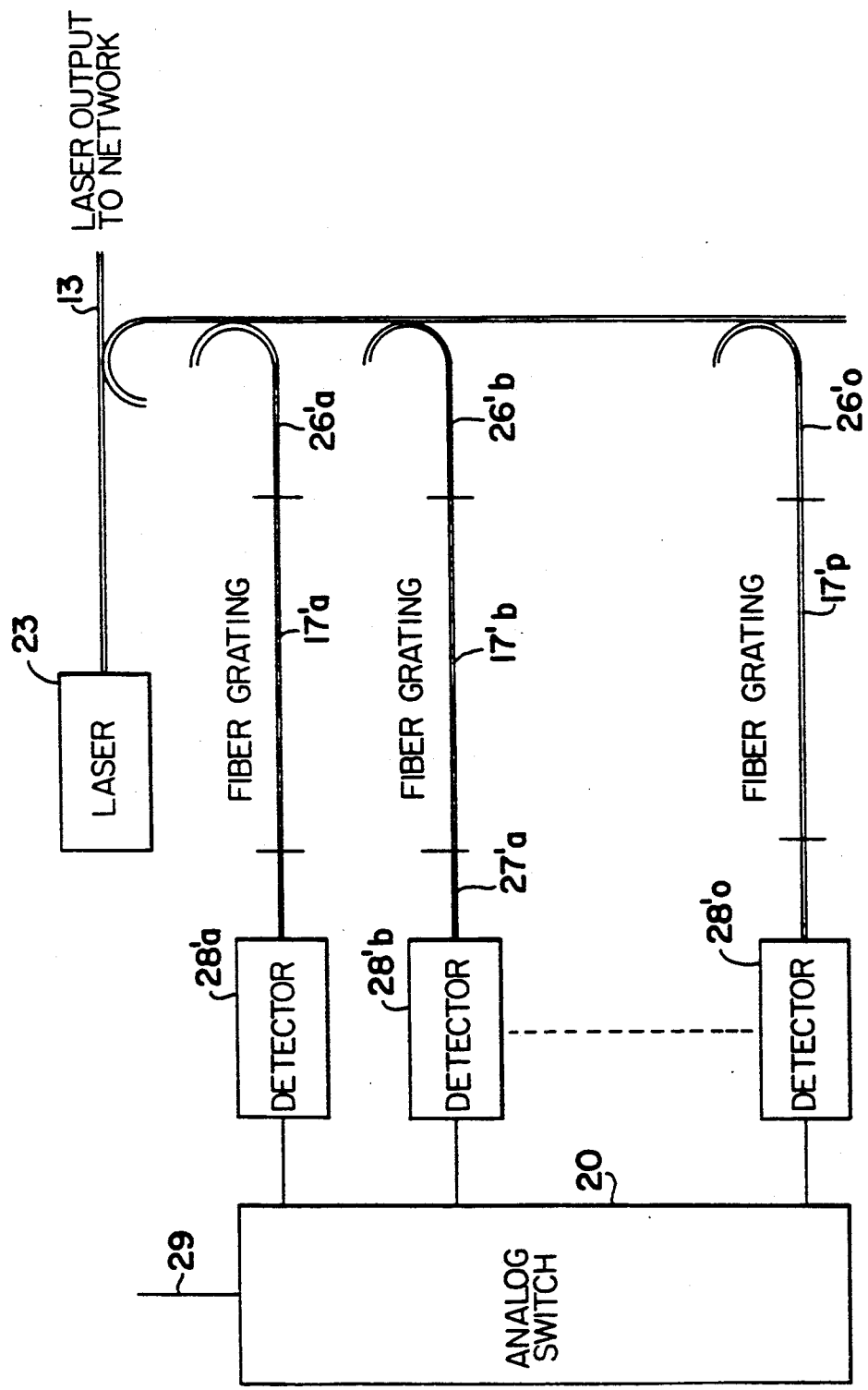
FIG. 4 is a view similar to that of FIG. 3 but of an arrangement utilizing a plurality of Bragg fiber gratings of different stopbands, and a switching device operative for selecting one of such gratings.

Another approach to the tuning of the laser 23 is illustrated in FIG. 4 of the drawing where a plurality of fixed gratings 17'a to 17'o akin to the grating 17, each of a different periodicity and hence having its stopband at a different frequency, is incorporated in separate branches 26'a to 26'o and 27'a to 27'o leading to separate light detectors 28'a to 28'o. The electrical signals from the detectors 28'a to 28'o are then supplied to a switching arrangement 40 which selectively supplies such electrical signals to the . electric connecting line 29 (leading to the mixer 30), in dependence on which carrier frequency the laser 23 is to be tuned to.

FIG. 5 of the drawing shows an alternative approach to the arrangement of the aforementioned receivers which are identified by reference numerals 12'a to 12'm in this instance. The receivers 12'a to 12'm are arranged along a common optical link 14, such as an optical fiber or bus, which incorporates individual gratings 17'a to 17'm of the type discussed above. These gratings 17'a to 17'm are spaced along the optical link 14 and each of them has a different frequency of its stopband so as to reflect light only in this stopband toward the associated one of the receivers 12a' to 12'm. In this manner, it is possible to build a passive linear frequency division multiplex data bus in which the fiber gratings 17'a to 17'm are used to form frequency selective taps. Identical gratings 17 then determine the frequencies of a tunable transmitter which can address the taps by tuning to the appropriate frequency.

The optical power budget in the types of networks described above is dominated by power division losses and limits the number of terminals on the network. State of the art single-mode laser diodes of the type contemplated for use in such networks currently provide up to 100 mW optical power output. Given 10 dB source coupling loss to provide 10 dBm to the network, $-47$ dBm heterodyne receiver sensitivity at 1 Gbs, and $-10$ dB excess system losses, the system power budget for power division would be 47 dB. Power division over 1,000 channels would appear as a 30 dB loss per channel, leaving a 17 dB margin.

A variety of signal modulation techniques could be used in networks of the above kind. Available options include analog frequency modulation, digital frequency shift keying, and spread spectrum. Amplitude and phase modulation are not currently practical because amplitude modulation would cause excessive chirp in the laser frequency and the commercial lasers discussed above have excessive phase noise. An array of switchable gratings for laser frequency control opens the possibility of spread spectrum coding techniques in the optical domain to achieve secure communications. The above system is also capable of achieving simultaneous transmission of digital FSK, analog FM, video, and digital spread spectrum information.

To summarize, it may be seen that, by using coherent optical receivers, frequency modulation of semiconductor laser diodes, and narrow-band refractive index grating filters 17 in optical fibers, it is possible to achieve as little as 4 GHz channel spacing for optical frequency division multiplex. Current and future telecommunication networks require high capacity, multi-channel transmission capability in secure, easily deployable transmission media. The present invention provides an approach that fulfils the above needs, by implementing a dense optical FDM system using an optical fiber grating filter 17 to allow extremely close (4–6 GHz) optical channel spacing.

The use of embedded fiber gratings as the frequency standards 17 provides an improved approach to aligning the frequencies of lasers and filters in frequency multiplex systems. These gratings 17 have several advantages. For one, they can be reproduced to precise specifications. Therefore, they can be used as standards throughout a network. The frequency of the fiber grating filter 17 can be controlled in production with an accuracy of 1 GHz whereas the frequency of laser diodes cannot be controlled in production to better than 300 GHz without unacceptably low yields. Thus, a coherent optical receiver using a fiber grating 17 as frequency reference or standard in the local oscillator can tune directly to an optical frequency within 1 GHz without a complex, time consuming search and acquisition algorithm. Unlike gas absorption cells, the frequency of the grating 17 can be anywhere in the emission band of semiconductor lasers. Unlike other optical filter types, the fiber gratings 17 provide the narrow filter characteristic required for dense frequency division multiplex networks.

Stable, narrow-band optical filters of the above type using embedded index gratings 17 in optical fibers allow dense carrier spacing in the optical domain and avoid the need for complex electronic frequency tracking. These gratings 17 are formed in the fiber core using a nondestructive technique (i.e., no fiber lapping/cladding removal). The stability of these gratings 17 as a frequency reference is comparable to that of radio frequency oscillators and an order of magnitude better than that of semiconductor laser diodes. The uncompensated temperature drift of these gratings 17 is only 7 ppm/° C. compared to 5 ppm/° C. for UHF oscillators and 80 ppm/° C. for laser transmitters. This stability allows channel spacing in the optical domain equal to the direct modulation bandwidth of semiconductor laser diodes, thus providing maximum utilization of the optical fiber transmission bandwidth. Therefore, such narrow-band filters 17 can be used as the basis of a dense optical FDM system where the optical carriers are separated by 4–6 GHz rather than the conventional > 600 GHz separation.

While the present invention has been illustrated and described as embodied in particular constructions of optical communication systems, it will be appreciated that the present invention is not limited to this particular example; rather, the scope of protection of the present invention is to be determined solely from the attached claims.

We claim:

1. An optical waveguide communication system comprising
    at least one optical transmitter;
    at least one optical receiver; and
    at least one optical communication link connecting said optical transmitter with said optical receiver;
    at least one of said transmitter and receiver including a narrowband laser source that includes
    an optical fiber section including a core centered on a longitudinal axis and a cladding surrounding said core, and having a grating region embedded in said core, said grating region including a multitude of Bragg grating elements extending with a substantially equal longitudinal spacing substantially normal to said longitudinal axis for said grating region to significantly reduce the amount of light passing therethrough when the frequency of such light is in a predetermined narrow range around and including a predetermined center frequency, to an extent proportionate to the deviation of such frequency from said center frequency,
    a laser operative for issuing light at any frequency within a frequency band including said narrow range in dependence on the amount of electric energy applied thereto,
    electric excitation means for causing said laser to operate at a frequency within said narrow range,
    means for supplying a portion of the light issued by said laser into said core for propagation longitudinally thereof toward said grating region,
    means for detecting the amount of light passing through said grating region and issuing an electric error signal indicative of the extent and direction of deviation of the frequency of such light from said center frequency, and
    means for controlling said electric excitation means in the sense of varying the amount of electric energy supplied to said laser in proportion to the value of said electrical error signal.

2. A narrowband laser source for use in an optical waveguide communication system including at least one optical transmitter, at least one optical receiver, and at least one optical communication link connecting the optical transmitter with the optical receiver, at least at one of the receiver and transmitter, said laser source comprising
    an optical fiber section including a core centered on a longitudinal axis and a cladding surrounding said core, and having a grating region embedded in said core, said grating region including a multitude of Bragg grating elements extending with a substantially equal longitudinal spacing substantially normal to said longitudinal axis for said grating region to significantly reduce the amount of light passing therethrough when the frequency of such light is in a predetermined narrow range around and including a predetermined center frequency, to an extent proportionate to the deviation of such frequency from said center frequency,
    a laser operative for issuing light at any frequency within a frequency band including said narrow range in dependence on the amount of electric energy applied thereto;
    electric excitation means for causing said laser to operate at a frequency within said narrow range;
    means for supplying a portion of the light issued by said laser into said core for propagation longitudinally thereof toward said grating region;
    means for detecting the amount of light passing through said grating region and issuing an electrical error signal indicative of the extend and direction of deviation of the frequency of such light from said center frequency; and
    means for controlling said electric excitation means in the sense of varying the amount of electric energy supplied to said laser in proportion to the value of said electrical error signal.

* * * * *

UNITED STATES PATENT AND TRADEMARK OFFICE
CERTIFICATE OF CORRECTION

PATENT NO. : 5,077,816
DATED : December 31, 1991
INVENTOR(S) : Walter L. Glomb, Frederick J. Leonberger It is certified that error appears in the above-identified patent and that said Letters Patent is hereby corrected as shown below: On the title page, Item [22]:

Filing Date: "16" should be --26--

Column 9, Claim 1, Line 36 "electric" should be --electrical--

Column 10, Claim 2, Line 34 "extend" should be --extent--

Signed and Sealed this

Thirty-first Day of August, 1993

Attest:

BRUCE LEHMAN

Attesting Officer

Commissioner of Patents and Trademarks